(12) United States Patent
Fukase et al.

(10) Patent No.: US 9,620,444 B2
(45) Date of Patent: Apr. 11, 2017

(54) POWER SEMICONDUCTOR DEVICE

(75) Inventors: Tatsuya Fukase, Tokyo (JP); Dai Nakajima, Tokyo (JP); Masahiko Fujita, Tokyo (JP); Masaki Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 90 days.

(21) Appl. No.: 14/402,538

(22) PCT Filed: Sep. 7, 2012

(86) PCT No.: PCT/JP2012/072908
§ 371 (c)(1),
(2), (4) Date: Nov. 20, 2014

(87) PCT Pub. No.: WO2014/038066
PCT Pub. Date: Mar. 13, 2014

(65) Prior Publication Data
US 2015/0287670 A1 Oct. 8, 2015

(51) Int. Cl.
*H01G 4/228* (2006.01)
*H01L 23/495* (2006.01)
(Continued)

(52) U.S. Cl.
CPC .... *H01L 23/49589* (2013.01); *H01L 23/3107* (2013.01); *H01L 23/492* (2013.01);
(Continued)

(58) Field of Classification Search
CPC .......... H01G 4/01; H01G 4/005; H01G 4/002; H01G 4/012; H01G 4/228; H01G 9/008;
(Continued)

(56) References Cited

U.S. PATENT DOCUMENTS 6,381,117 B1 * 4/2002 Nakagawa ............... H01G 2/14
361/301.4
2001/0050181 A1 12/2001 Miura et al.
(Continued)

FOREIGN PATENT DOCUMENTS

GB 2354112 A 3/2001
JP 59-072757 A 4/1984
(Continued)

OTHER PUBLICATIONS

Communication dated Apr. 12, 2016 from the European Patent Office in counterpart application No. 12884280.4.
(Continued)

*Primary Examiner* — Binh Tran
(74) *Attorney, Agent, or Firm* — Sughrue Mion, PLLC; Richard C. Turner (57) ABSTRACT

According to a power semiconductor device of the present invention, it comprises a plurality of lead frames formed into like a wiring pattern, a power semiconductor element joined onto the lead frame, and a capacitor placed between mutually adjacent two lead frames, and is encapsulated with a mold resin. The capacitor is characterized in that external electrodes of that capacitor are connected to the lead frames each through a stress-relaxation structure portion that is lower in rigidity than the capacitor.

16 Claims, 6 Drawing Sheets

(51) Int. Cl.
*H05K 1/18* (2006.01)
*H01L 23/31* (2006.01)
*H01L 23/492* (2006.01)
*H01L 23/00* (2006.01)
*H05K 3/10* (2006.01)
*H01G 9/00* (2006.01)
*H01G 4/005* (2006.01)
*H01G 4/012* (2006.01)
*H01G 4/236* (2006.01)
*H01G 2/20* (2006.01)
*H05K 3/20* (2006.01)

(52) U.S. Cl.
CPC .... *H01L 23/4952* (2013.01); *H01L 23/49531* (2013.01); *H01L 23/49537* (2013.01); *H01L 23/49562* (2013.01); *H01L 23/49575* (2013.01); *H01L 23/562* (2013.01); *H05K 1/186* (2013.01); *H05K 3/103* (2013.01); *H01L 24/48* (2013.01); *H01L 24/49* (2013.01); *H01L 2224/05624* (2013.01); *H01L 2224/45124* (2013.01); *H01L 2224/45147* (2013.01); *H01L 2224/48091* (2013.01); *H01L 2224/48247* (2013.01); *H01L 2224/48472* (2013.01); *H01L 2224/49111* (2013.01); *H01L 2224/85399* (2013.01); *H01L 2924/00014* (2013.01); *H01L 2924/1033* (2013.01); *H01L 2924/10254* (2013.01); *H01L 2924/10272* (2013.01); *H01L 2924/1305* (2013.01); *H01L 2924/13055* (2013.01); *H01L 2924/13091* (2013.01); *H01L 2924/19041* (2013.01); *H01L 2924/19105* (2013.01); *H01L 2924/19107* (2013.01); *H01L 2924/30107* (2013.01); *H05K 3/202* (2013.01); *H05K 2201/09118* (2013.01); *H05K 2201/10015* (2013.01); *H05K 2201/10166* (2013.01); *H05K 2201/10636* (2013.01); *H05K 2201/10962* (2013.01); *Y02P 70/611* (2015.11)

(58) Field of Classification Search
CPC .... H05K 1/185; H05K 2201/10; H01L 21/56; H01L 23/28; H01L 31/0203; H01L 31/048; H01L 33/52
USPC ......... 361/303, 304, 306.1, 307, 308.1, 310, 361/761, 765, 769, 540; 174/521, 174/527–530; 257/787, 788, 789
See application file for complete search history.

(56) References Cited

U.S. PATENT DOCUMENTS

| 2003/0030149 | A1 | 2/2003 | Miura et al. | |
| 2011/0291236 | A1* | 12/2011 | Hayashi | H01L 23/49537 257/532 |
| 2013/0175012 | A1* | 7/2013 | Yamada | H02K 11/33 165/121 |

FOREIGN PATENT DOCUMENTS

| JP | 1-276655 A | 11/1989 |
| JP | 9-36298 A | 2/1997 |
| JP | 11-238963 A | 8/1999 |
| JP | 2002-57064 A | 2/2002 |
| JP | 2002-076605 A | 3/2002 |
| JP | 2004-031768 A | 1/2004 |
| JP | 2006-324629 A | 11/2006 |
| JP | 2007-234737 A | 9/2007 |
| JP | 2008-166301 A | 7/2008 |
| JP | 2009-032865 A | 2/2009 |
| JP | 2011-003818 A | 1/2011 |
| JP | 2011-238906 A | 11/2011 |
| JP | 2012-164796 A | 8/2012 |

OTHER PUBLICATIONS

International Search Report for PCT/JP2012/072908 dated Oct. 16, 2012.
Communication dated Jan. 5, 2016 from the Japanese Patent Office issued in corresponding Application No. 2014-534126.

* cited by examiner

POWER SEMICONDUCTOR DEVICE

CROSS REFERENCE TO RELATED APPLICATIONS

This application is a National Stage of International Application No. PCT/JP2012/072908 filed Sep. 7, 2012, the contents of all of which are incorporated herein by reference in their entirety.

TECHNICAL FIELD

The present invention relates to a transfer-mold type power semiconductor device provided internally with a capacitor and, in particular, to a power semiconductor device to be mounted in an in-vehicle apparatus.

BACKGROUND ART

Nowadays, in the context of global warming, there is a growing demand for transportation machines to improve fuel consumption. For in-vehicle electric components to be mounted, in particular, in automobiles, there is an urgent need to further reduce their size and weight. In addition, among the in-vehicle electric components, with respect to rotating electrical machines for vehicle, such as an alternator, attempts have been actively made directed to improvement in power generation efficiency and power conversion efficiency. As one of these, there is an attempt to apply an inverter configuration to a power conversion unit in place of a rectifier or the like. As compared to the rotating electrical machine with a rectifier, the rotating electrical machine with the power conversion unit to which an inverter configuration is applied, is sophisticated in control of its output current, so that it is allowed to add thereto a new function of generating regenerative power, starting engine or the like.

Meanwhile, in the rectifier for in-vehicle apparatus, a diode is used as a power semiconductor element, whereas, in the inverter for in-vehicle apparatus, a MOS-FET (Metal Oxide Semiconductor—Field Effect Transistor) or an IGBT (Insulated Gate Bipolar Transistor) is used. These power semiconductor elements used in the inverter are switching elements that turn on/off (ON-OFF) with voltages applied to their gates, and have a smaller current loss (hereinafter represented as ON-resistance) at the time of gate-on, as compared to the diode. Thus, in the in-vehicle apparatus with the power conversion unit to which an inverter configuration is applied, the power generation efficiency and/or the power conversion efficiency are improved. Further, the switching element such as a MOS-FET or an IGBT is also used in the power semiconductor device for controlling field current in an alternator or a motor generator. The power semiconductor element for controlling the field current is placed in a path through which power is supplied to the field winding of a rotor as a rotator member, and controls the field current.

In-vehicle power semiconductor devices to be mounted in these in-vehicle electric components are conventionally fabricated by incorporating, for example, an encased-type power semiconductor device which is configured by soldering a power semiconductor element on an insulative board with a patterned wiring and making connections using wiring members followed by encapsulating the resultant with a silicone gel or the like, or a mono-functional discrete-type power semiconductor device which is configured by subjecting a diode, MOS-FET or like element to transfer molding. Such a power semiconductor device is placed near a heat dissipater such as a heat sink of the in-vehicle apparatus, so that heat generated by the power semiconductor element is discharged through the heat dissipater.

The power semiconductor device of the in-vehicle electric component is, because of small space for mounting it, required to be downsized. However, in the power semiconductor device which is to be mounted in the in-vehicle electric component and in which a power semiconductor element given as a switching element, such as a MOS-FET or an IGBT, is mounted, current intermittently flows due to switching of the power semiconductor element. As to the power semiconductor device, it is required to provide a capacitor for mitigating voltage variation at the time of switching of the power semiconductor element. The capacitor is required to be placed near the power semiconductor device, and this causes an obstructive factor against downsizing of the rotating electrical machine.

For example, in Patent Document 1, there is disclosed a mold-type semiconductor device in which a chip capacitor is attached to a lead frame at between a power source and the ground, and a low-power integrated circuit (IC chip) and the chip capacitor are encapsulated with a resin. This semiconductor device has a configuration in which the capacitor is mounted on a tie bar of the lead frame and encapsulated with a resin. This allows the capacitor to be mounted near the low-power integrated circuit, as well as achieves noise reduction.

CITATION LIST

Patent Document

Patent Document 1: Japanese Patent Application Laid-open No. S59-72757 (FIG. 2)

SUMMARY OF THE INVENTION

Problems to be Solved by the Invention

In Patent Document 1, described is a semiconductor device structure that provides a reduced inductance and an increased mounting density because of encapsulation of the integrated circuit (IC chip) and the chip capacitor with the resin. Even as the power semiconductor device in which the power semiconductor element such as a MOS-FET and an IGBT is mounted, we have thought a wish to achieve a transfer-mold type compact power semiconductor device by encapsulating the power semiconductor element and the capacitor for mitigating voltage variation at the time of switching of the power semiconductor element. The power semiconductor device is necessary to operate in harsh environments as compared to the semiconductor device with a low-power integrated circuit or the like, and thus the power semiconductor device undergoes large amplitude of temperature cycle.

Accordingly, in the case of the power semiconductor device, merely mounting the capacitor on the tie bar of the lead frame followed by encapsulating them with resin as disclosed in Patent Document 1, will result in a failure of the capacitor at the time of operation in harsh environments or at the time of fabrication.

That is, according to the structure disclosed in Patent Document 1, there is a problem that the capacitor fails due to the temperature cycle that the power semiconductor device undergoes or a molding pressure at the time of mold-forming.

Meanwhile, in the power semiconductor device, because a larger current flows as compared to a general integrated circuit (IC chip), the thickness of the lead frame is made thicker. Thus, in the power semiconductor device, a level difference of about several μm to several tens of μm inevitably emerges between terminals of the lead frame where the capacitor is mounted, so that parallelism between a capacitor mounting portion of the lead frame and an external electrode of the capacitor becomes different at two external electrodes thereof. Because the level difference varies to become smaller due to the molding pressure at the time of mold-forming, or the vibration of the lead frame occurring at the time of transportation in fabrication processing is propagated to the capacitor, a large stress is applied to the capacitor. Thus, there is also a problem that the capacitor fails due to the large stress applied to the capacitor, so that the production yield is reduced.

The present invention has been made to solve the problems as described above, and an object thereof is to prevent a capacitor in the transfer-mold type power semiconductor device provided internally with the capacitor, from failing at the time of operation or at the time of fabrication.

Means for Solving the Problems

The power semiconductor device according to the invention is a power semiconductor device encapsulated with a mold resin which comprises: a plurality of lead frames formed into like a wiring pattern; a power semiconductor element joined onto the lead frame; and a capacitor placed between mutually adjacent two of the lead frames; wherein the capacitor is characterized in that external electrodes of the capacitor are connected to the lead frames each through a stress-relaxation structure portion that is lower in rigidity than the capacitor.

Effect of the Invention

According to the power semiconductor device in accordance with the invention, since the external electrodes of the capacitor are connected to the lead frames each through the stress-relaxation structure portion that is lower in rigidity than the capacitor, the stress to be produced in the capacitor at the time of operation or at the time of fabrication is mitigated by the stress-relaxation structure portion that is lower in rigidity than the capacitor, so that the capacitor is prevented from being broken down.

MODES FOR CARRYING OUT THE INVENTION

Embodiment 1

Figure 1:
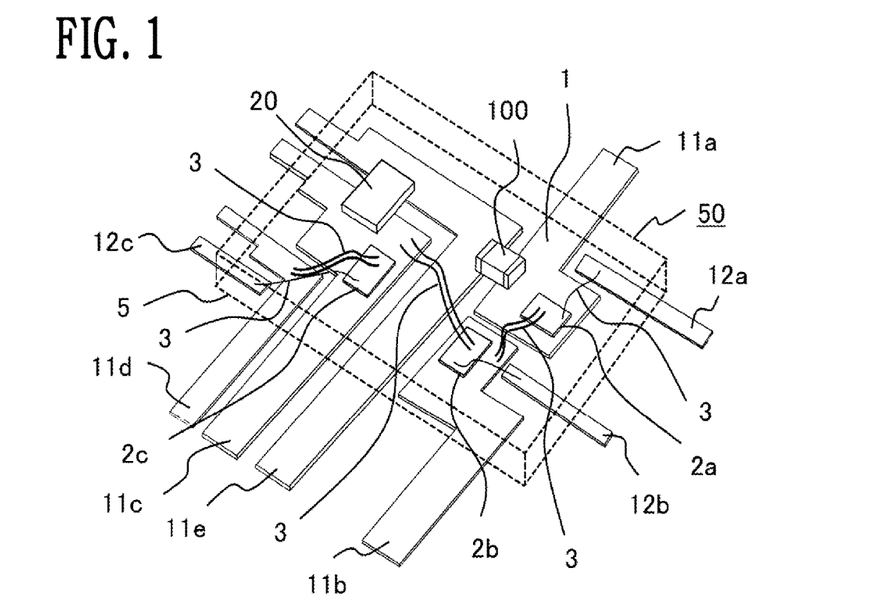
FIG. 1 is a schematic overview diagram of the inside of a power semiconductor device according to Embodiment 1 of the invention.
Figure 2:
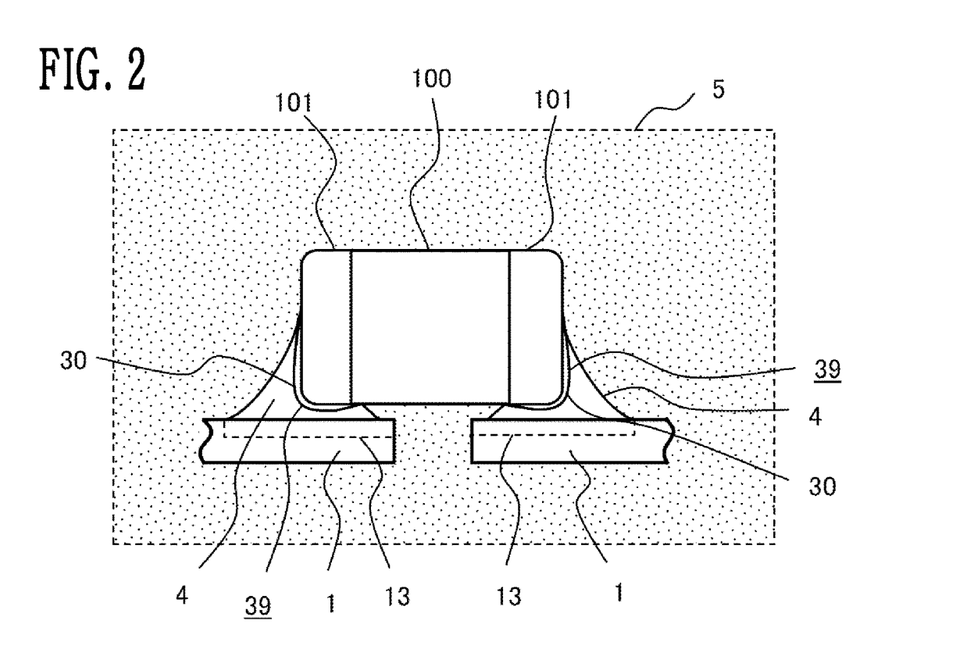
FIG. 2 is a diagram showing a stress-relaxation structure portion according to Embodiment 1 of the invention.

FIG. 1 is a schematic overview diagram of the inside of a power semiconductor device according to Embodiment 1 of the invention, and FIG. 2 is a diagram showing a stress-relaxation structure portion according to Embodiment 1 of the invention. A power semiconductor device 50 of Embodiment 1 includes: a plurality of lead frames 1 formed into like a wiring pattern; power semiconductor elements 2 that can perform switching; a ceramic capacitor (also arbitrarily referred to as "capacitor") 100 for mitigating voltage variation due to switching of the power semiconductor elements 2; a chip component such as a chip resistor (also arbitrarily referred to as "resistor") 20; wiring members 3 that make connections between the plural lead frames 1 having terminals formed therein, and connections between the lead frames 1 and the power semiconductor elements 2; and a mold resin 5 that encapsulates the lead frames 1, mounting components such as the power semiconductor elements 2, the chip component and the like, and the wiring members 3. In FIG. 1, there is shown an example of the power semiconductor device 50 in which three power semiconductor elements 2a, 2b, 2c are mounted and five power terminals 11a, 11b, 11c, 11d, 11e and three signal terminals 12a, 12b, 12c are included. Note that, with respect the reference numeral of the power semiconductor elements, the numeral 2 is used collectively, whereas the numerals 2a, 2b, 2c are used when these elements are to be described distinctly. With respect to the reference numeral of the power terminals, the numeral 11 is used collectively, whereas the numerals 11a, 11b, 11c, 11d, 11e are used when these terminals are to be described distinctly. With respect to the reference numeral of the signal terminals, the numeral 12 is used collectively, whereas the numerals 12a, 12b, 12c are used when these terminals are to be described distinctly.

The power semiconductor device 50 is fixed to an in-vehicle apparatus through an insulative adhesive, an insulative board, an insulative sheet or the like. Meanwhile, there is also a case where the power semiconductor device 50 has an insulative layer on its face opposite to a portion to which the power semiconductor device 50 is fixed, and is pressure-fixed by soldering or through a heat-dissipative grease. Outwardly protruding terminals of the power semiconductor device 50 include the power terminals 11 through which a large current of several A to one hundred and several tens of A flows, and the signal terminals 12 for controlling, such as gate signal lines of the power semiconductor elements 2 and sensor signal lines. The power terminals 11 are connected through intermediary members to a power source such as a power supplying apparatus, a battery and the like, and the signal terminals 12 for controlling are connected to a control board mounted in the in-vehicle apparatus.

The power semiconductor device 50 mounts therein the power semiconductor elements 2 such as MOS-FETs or IGBTs that can perform switching, and controls the amounts of currents caused to flow through the power terminals 11 for outputting (for example, 11a, 11b, 11c) by causing the elements to perform switching using signals transmitted from the gate signal lines connected to the control board.

With respect to joining between the lower face of each power semiconductor element 2 (a face opposite to each lead frame 1) and the lead frame 1, they are attached to each other by means of a solder 4 or an electro-conductive bonding material such as an electro-conductive paste. Each of electrode portions formed on the chip of the power semiconductor element 2 and the lead frame 1 are connected to each other by a wiring member 3, such as, a wire bond formed from a cross-sectionally circular or rectangular wire made of aluminum or copper by bonding it using ultrasonic vibration, the lead frame 1 to be used for wiring, a terminal made of metal, or the like.

The lead frames 1 and the mounting components, such as the ceramic capacitor 100, the chip resistor 20 and the like, are joined to each other using a bonding material such as a solder 4. The ceramic capacitor 100 is a laminated ceramic capacitor in which dielectric portions and electrode portions are laminated, and is provided with external electrodes 101 formed of external electrode layers. Where the ceramic capacitor 100 is mounted is between two of the lead frames 1, and potentials of the two lead frames 1 are different to each other. Meanwhile, the plurality of lead frames 1 are formed by press processing and/or etching processing, and there is a level difference of about several μm to several tens of μm between the respective lead frames 1.

The power semiconductor device 50 is configured by joining the power semiconductor elements 2 and the other mounting components onto the lead frames 1 using the bonding material, making connections using the wiring members 3, and then encapsulating the resultant with the mold resin 5. In order to efficiently discharge heat that is generated when a current flows through the internally-mounted power semiconductor element 2, toward a power-semiconductor-device joining portion of an in-vehicle apparatus to which the power semiconductor device 50 is joined, there is a case where the power semiconductor device 50 is provided with a lead-frame exposed face where the lead frame 1 is partially exposed, in the face of the power semiconductor device 50 opposite to the power-semiconductor-device joining portion of the in-vehicle apparatus. For example in FIG. 1, the lead-frame exposed face of the power semiconductor device 50 is formed in its face (back face) in the side where the power semiconductor elements 2 and the chip components etc., are not mounted. The lead-frame exposed face of the power semiconductor device 50 is joined to the power-semiconductor-device joining portion of the in-vehicle apparatus through an insulating portion having a small thermal resistance. This causes the heat generated from the power semiconductor elements 2 to be efficiently dissipated toward the power-semiconductor-device joining portion of the in-vehicle apparatus and then to be dissipated out through a heat sink, etc., that is placed in the in-vehicle apparatus.

Here, the power semiconductor device 50 of the invention is provided with a conventional configuration which comprises: the plurality of lead frames 1 formed into like a wiring pattern; the power semiconductor elements 2 joined onto the lead frames 1; the wiring members 3 that make connections between the plural lead frames 1 having the terminals formed therein, and connections between the lead frames 1 and the electrode portions formed on the power semiconductor elements 2; the bonding material for joining a lower face electrode portion formed on the lower face of each power semiconductor element 2 and the lead frame 1 together; and the mold resin 5 that encloses the lead frames 1, the power semiconductor elements 2, the wiring members 3 and the bonding material. In addition, in the circuit formed inside the power semiconductor device 50, there is provided the capacitor 100 for mitigating voltage variation at the time of switching of the power semiconductor element 2. As shown in FIG. 2, the power semiconductor device 50 of the invention includes a stress-relaxation structure portion 39 between each external electrode portion 101 of the capacitor 100 and a capacitor mounting portion 13 of each lead frame 1.

The temperature of the power semiconductor device 50 varies largely depending on an operation of the in-vehicle apparatus, a change in the ambient temperature of the setting place, a current-flow through the power semiconductor element 2, and the like. When the variation in the temperature of the power semiconductor device 50 is large, since a thermal stress to be produced in the capacitor 100 increases due to a difference in linear expansion coefficient between the capacitor 100 and its surrounding component, it has been difficult to adopt such a structure that is configured simply by mounting the capacitor 100 on the lead frame 1 followed by encapsulating them with the mold resin 5. However, with the configuration of this invention, even if the power semiconductor device 50 is to be mounted in an in-vehicle apparatus having a large temperature variation, it is possible to employ such a power semiconductor device 50 with a structure in which the capacitor 100 is mounted between the two lead frames 1 and they are encapsulated with the mold resin 5. Further, at the time of fabrication of the power semiconductor device 50, even at the time the intermediate product in which the capacitor 100 is joined to and between the two lead frames 1 is transported on the fabrication line, the stress-relaxation structure portion 39 mitigates the stress to the capacitor 100 due to vibration and the stress to the capacitor 100 at the time an external force is applied thereto during its transportation, to thereby prevent the capacitor from failing, so that the fabrication yield can be enhanced.

The external electrodes 101 of the capacitor 100 and the capacitor mounting portions 13 of the lead frames 1 are joined to each other by means of the solder 4. The power semiconductor device 50 according to the invention has a structure in which, between the solder 4 which is an electro-conductive bonding material for the capacitor mounting portion 13 and the external electrode 101, the stress-relaxation structure portion 39 is provided that is lower in rigidity than the electro-conductive bonding material, and their surrounding is enclosed with the mold resin 5. As the stress-relaxation structure portion 39, it suffices, for example, to use an electro-conductive stress-relaxation portion 30 that is a stress relaxation layer formed of a low elastic modulus resin, such as an epoxy resin, a silicone resin or the like, in which an electro-conductive filler is mixed. In this case, by having made the elastic modulus of the electro-conductive stress-relaxation portion 30 lower than the elastic modulus of the mold resin 5, a required stress relaxation function can be exerted. As the electro-conductive filler, a finely particulate metal is suitable. Accordingly, the stress-relaxation structure portion 39 deforms when a temperature variation occurs in the power semiconductor device 50 to thereby produce a distortion due to difference in linear expansion coefficient between the structural components that construct the power semiconductor device 50, so that the thermal stress to be produced in the capacitor 100 is mitigated. Thus, it is prevented that the joining portion between the capacitor 100 and the lead frame 1 is broken down and that the capacitor 100 fails.

The stress-relaxation structure portion 39 is formed of the electro-conductive member containing the electro-conductive filler. In FIG. 2, such a case is shown where the stress-relaxation structure portion 39 is placed only around the electro-conductive bonding material (solder 4); however, it may be placed as it covers the external electrode 101. In these two exemplified cases, when a pretreatment is applied that affixes the stress-relaxation structure portion 39 onto each external electrode 101 of the capacitor 100, the efficiency in production processing is enhanced.

Meanwhile, as described previously, a level difference of about several μm to several tens of μm emerges between the capacitor mounting portions 13 of the two lead frames 1 that mount the capacitor 100. If an intermediate product having the capacitor 100 mounted therein is encapsulated with the mold resin 5 under the presence of that level difference, the level difference between the two lead frames 1 varies to become smaller due to the molding pressure reaching even up to about 100 atmospheres or due to a mold clamping at the time of molding, so that a crack may occur in the capacitor 100 in some cases. Thus, even when encapsulating with the mold resin 5, the stress-relaxation structure portion 39 that is lower in rigidity than the electro-conductive bonding material (solder 4) deforms preferentially, so that the stress to be produced in the capacitor 100 can be mitigated. This makes it possible to prevent occurrence of a crack in the capacitor 100 and to prevent reduction in the yield of the fabrication process. Further, also when the intermediate product before mold encapsulation in which the capacitor 100 is joined to the lead frames 1 is transported on the fabrication line, the stress-relaxation structure portion 39 can mitigate the stress to the capacitor 100 due to vibration and the stress to the capacitor 100 at the time an external force is applied thereto during its transportation.

The joining portion between the capacitor 100 and each lead frame 1 that includes the stress-relaxation structure portion 39, is finally covered with the mold resin 5. At the time the stress-relaxation structure portion 39 mitigates the aforementioned stress, even if the stress-relaxation structure portion 39 becomes distorted or largely deforms such that a slit is formed partially in the stress-relaxation structure portion 39, because the capacitor 100 and the lead frames 1 are preserved by the mold resin 5, the fixing strength of the capacitor is not lowered, so that it is possible to prevent loss of function or failure in function of the power semiconductor device 50. Further because the stress-relaxation structure portion 39 is lower in rigidity than the solder 4 and the capacitor 100, if perchance it is out of the standard such as when there is a particularly large level difference between the two capacitor mounting portions 13, the stress-relaxation structure portion 39 will be broken down to cause an open failure. Since the failure can easily be detected, it is possible to reduce the facility cost for an inspection apparatus or the like.

Figure 3:
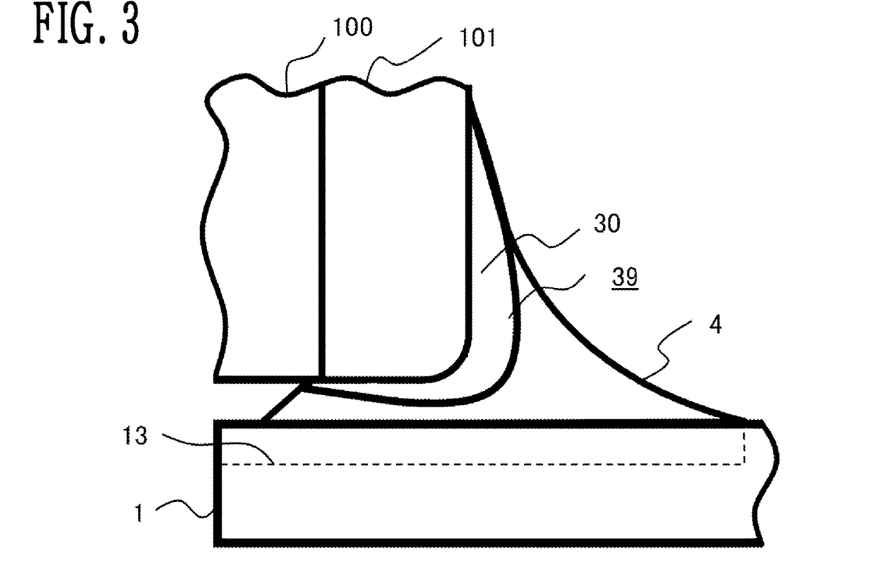
FIG. 3 is an enlarged view of a stress-relaxation structure portion according to Embodiment 1 of the invention.

FIG. 3 is a diagram showing the stress-relaxation structure portion according to Embodiment 1 of the invention. As previously described, the stress-relaxation structure portion 39 is formed of a mixture of the electro-conductive filler and a resin material. The rigidity of the stress-relaxation structure portion 39 is made largely lower than the rigidity of the electro-conductive bonding material (solder 4) for joining the capacitor 100 to the lead frame 1. Accordingly, in the joining portion between the capacitor 100 and the lead frame 1, when a stress is produced, for example, due to the temperature cycle during operation of the power semiconductor device 50, due to the deformation that makes the level difference between the two lead frames 1 smaller at the time of mold-forming, or due to a stress at the time of transportation, the stress-relaxation structure portion 39 actively deforms to prevent the capacitor 100 from failing.

Figure 4:
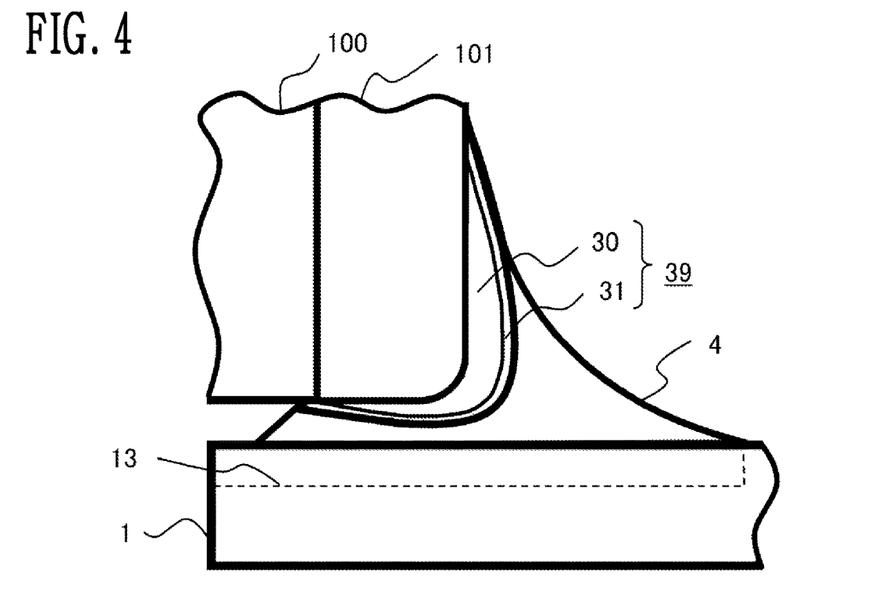
FIG. 4 is an enlarged view of another stress-relaxation structure portion according to Embodiment 1 of the invention.

Meanwhile, as shown in FIG. 4, the stress-relaxation structure portion 39 may instead be formed of an electro-conductive stress-relaxation portion 30 and a metal plating layer 31 of such as Ni or Sn, that is provided on the surface of the electro-conductive stress-relaxation portion 30. FIG. 4 is an enlarged view of another stress-relaxation structure portion according to Embodiment 1 of the invention. By providing the metal plating layer 31 of such as Ni or Sn, it is possible to be easily solderable as compared to the case of the electro-conductive stress-relaxation portion 30 alone.

Figure 5:
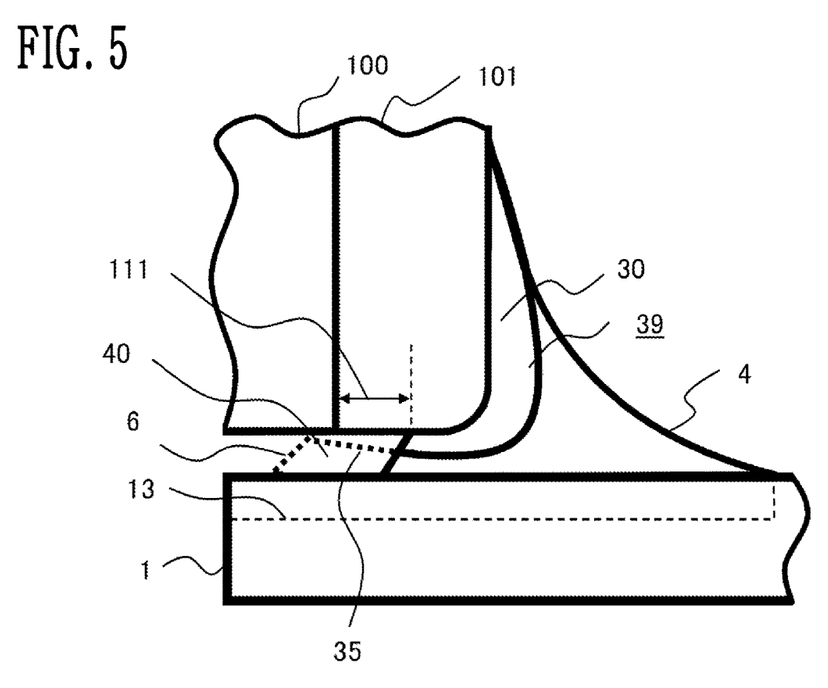
FIG. 5 is an enlarged view of still another stress-relaxation structure portion according to Embodiment 1 of the invention.

FIG. 5 is an enlarged view of still another stress-relaxation structure portion according to Embodiment 1 of the invention. FIG. 5 represents a case where there is a missing portion 40 that is a portion at which a part of the solder 4 and a part of the electro-conductive stress relaxation portion 30 are missing. A broken line 6 corresponds to an edge of the solder 4 when it was as shown in FIG. 3, and a broken line 35 corresponds to an edge of the electro-conductive stress relaxation portion 30 when it was as shown in FIG. 3. The capacitor 100 has a non-connected portion 111 to which the stress-relaxation structure portion 39 is not connected, on the external electrode 101 in the side opposite to the lead frame 1. According to the power semiconductor device 50 of Embodiment 1, even when a deformation associated with breakage such as a formation of a slit or a crack, occurs before its mold processing in a part of the stress-relaxation structure portion 39 provided between the capacitor 100 and the capacitor mounting portion 13 of the lead frame 1, the mold resin 5 is filled in the missing portion 40 formed in the stress-relaxation structure portion 39, in the mold processing. That is, even when the non-connected portion 111 is present, the non-connected portion 111 is covered with the mold resin 5 in the mold processing. Thus, the power semiconductor device 50 of Embodiment 1 has a structure by which, even when there is formed the missing portion 40 at which the solder and the electro-conductive stress-relaxation portion 30 are missing in the joining portion between the capacitor 100 and the lead frame 1, the mold resin 5 is filled in the missing portion 40.

The power semiconductor device 50 of Embodiment 1 is provided with a structure by which, when a stress acts to the capacitor 100 before the mold processing, the stress to be produced in the capacitor 100 is mitigated because of the stress-relaxation structure portion 39 deforming or being partially broken, and also provided with a structure by which the lead frames 1 and the mounting components such as the power semiconductor elements 2, the capacitor 100 and the like, are covered with the mold resin 5 without change in their state, that is, a structure that allows the mold resin 5 to penetrate into a portion where the stress-relaxation structure portion 39 has deformed or has been partially broken (missing portion 40). Thus, according to the power semiconductor device 50 of Embodiment 1, even when the stress-relaxation structure portion 39 deforms or is partially broken to thereby reduce the stress in the capacitor 100, it is possible to keep the strength for holding the capacitor 100 by the mold resin 5 that is complementally filled in the deformed or partially broken portion (missing portion 40).

Let's assume a structure different to the structure of the power semiconductor device 50 of Embodiment 1, for example, such a structure in which even with the stress-relaxation structure portion 39, the mold resin 5 is not placed therearound. In the power semiconductor device with this structure, there is a deformation associated with breakage of the stress-relaxation structure portion 39 that has occurred during the fabrication processing. Thus, when the power semiconductor device 50 undergoes a large temperature variation, a repetitive stress due to a difference in linear expansion coefficient between the components that construct the power semiconductor device, acts concentrically to the deformed portion (missing portion 40) formed into a cutout shape, so that a crack is developed and this crack finally results in a failure. Accordingly, in this case, there arises a need in the fabrication processing to inspect whether or not the stress-relaxation structure portion 39 has caused its deformation associated with breakage, so that the cost for inspection increases. However, with the structure of the invention, it is possible to avoid such an increase in the cost.

According to the power semiconductor device 50 of Embodiment 1, it comprises the plurality of lead frames 1 formed into like a wiring pattern, the power semiconductor element 2 joined onto the lead frame 1, and the capacitor 100 placed between mutually adjacent two lead frames 1, which are encapsulated with the mold resin 5. The capacitor 100 is characterized in that the external electrodes 101 of the capacitor 100 are connected to the lead frames 1 each through the stress-relaxation structure portion 39 that is lower in rigidity than the capacitor 100. Thus, the stress to be produced in the capacitor 100 at the time of operation or at the time of fabrication is mitigated by the stress-relaxation structure portion 39 that is lower in rigidity than the capacitor, so that the capacitor 100 can be prevented from being broken down.

Since the stress-relaxation structure portion 39 of Embodiment 1 includes the electro-conductive stress-relaxation portion 30 that is lower in rigidity than the solder 4 and the capacitor 100, the stress produced in the capacitor at the time of operation or at the time of fabrication is mitigated, so that the capacitor can be prevented from being broken down. According to the power semiconductor device 50 of Embodiment 1, the capacitor 100, the capacitor mounting portions 13 of the lead frames 1 and the stress-relaxation structure portions 39 are encapsulated with the mold resin 5. Thus, the thermal stress at the time of mold-forming or due to the temperature cycle under the operating environment is mitigated because of the electro-conductive stress-relaxation portion 30 deforming or being partially broken, so that it is possible to prevent a crack of the capacitor. On this occasion, even if the electro-conductive stress-relaxation portion 30 has partially deformed or has been partially broken, the capacitor 100 and the capacitor mounting portions 13 are preserved by the mold resin 5, so that the current path, or the circuit configuration between the lead frame 1 and the capacitor 100 is never broken down.

Since the electro-conductive stress-relaxation portion 30 in the stress-relaxation structure portions 39 of Embodiment 1, is formed of a mixture of the electro-conductive filler and a resin, it can be made largely lower in rigidity than the solder 4 and the capacitor 100.

The power semiconductor device 50 of Embodiment 1 is provided with a structure in which the lead frames 1 and the mounting components such as the power semiconductor element 2, the capacitor 100 and the like, are covered with the mold resin 5. Thus, even when the stress-relaxation structure portion 39 deforms or is partially broken to thereby reduce the stress in the capacitor 100, it is possible to keep the strength for holding the capacitor 100 by the mold resin 5 that is complementally filled in the deformed or partially broken portion (missing portion 40).

According to the power semiconductor device 50 of Embodiment 1, since the capacitor 100 for mitigating voltage variation at the time of switching of the power semiconductor element 2 is connected through the stress-relaxation structure portion 39 to the lead frame 1, it is possible to place the capacitor 100 near the power semiconductor element 2 to thereby downsize the power semiconductor device 50. The power semiconductor device 50 of Embodiment 1 can be used as a power semiconductor device for controlling an armature current or a field current of an inverter-integrated rotating machine. The armature current is a current that flows through an armature in the case where a stator is provided as the armature. The field current is a current that flows through a field winding wound around a rotor in the case where the rotor is provided as the armature. With respect to the power semiconductor device for controlling the armature current or the field current of an inverter-integrated rotating machine, the heat of the rotating machine is transferred to the power semiconductor device, so that the temperature of the power semiconductor device increases and also the stress due to difference in linear expansion coefficient becomes larger. Even with the inverter-integrated rotating machine that operates in such harsh environments, since the power semiconductor device 50 of Embodiment 1 is provided with the stress-relaxation structure portion 39, the stress to be produced in the capacitor 100 can be mitigated, so that the capacitor 100 is prevented from being broken down.

Embodiment 2

Figure 6:
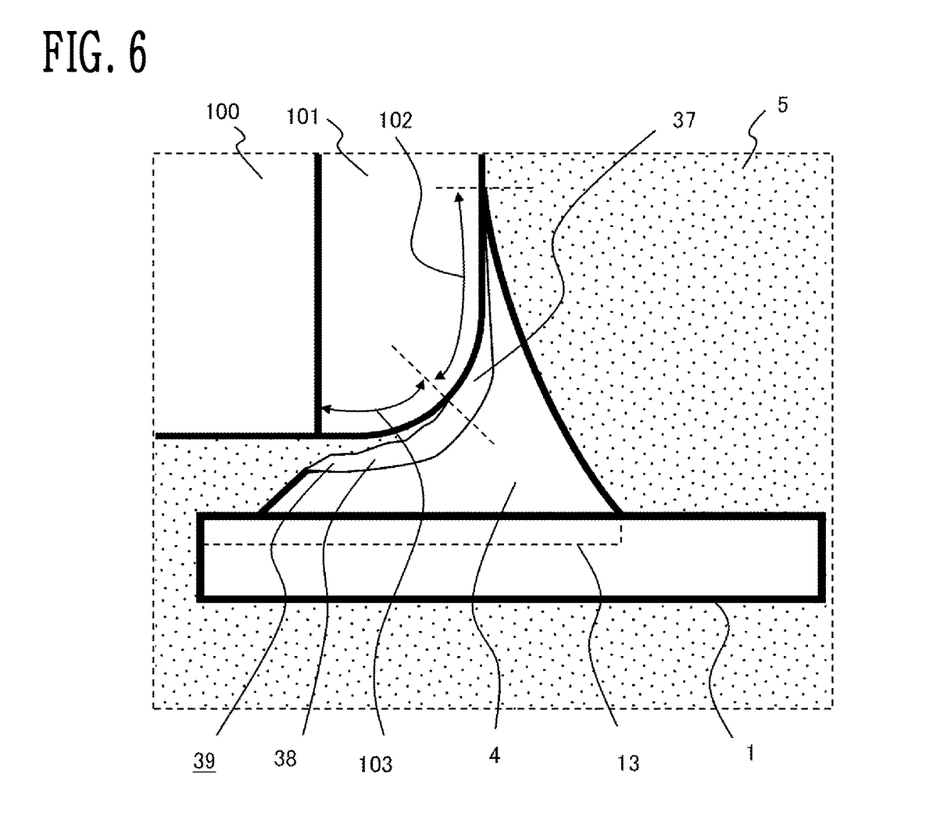
FIG. 6 is an enlarged view of a stress-relaxation structure portion according to Embodiment 2 of the invention.

FIG. 6 is an enlarged view of a stress-relaxation structure portion according to Embodiment 2. The stress-relaxation structure portion 39 according to the power semiconductor device 50 of Embodiment 2 includes an electrode connection portion 37 connected to the external electrode 101 of the capacitor 100, and an electrode non-connection portion 38 not connected to the external electrode 101. In the external electrode 101, a portion connected to the electrode connection portion 37 of the stress-relaxation structure portion 39 is referred to as a first electrode portion 102, and a portion not connected to the electrode connection portion 37 of the stress-relaxation structure portion 39 is referred to as a second electrode portion 103. In FIG. 6, the first electrode portion 102 is a portion indicated by an arrow range 102, and the second electrode portion 103 is a portion indicated by an arrow range 103. The second electrode portion 103 is formed in the side where the capacitor mounting portion 13 is placed, not in the upper side of the external electrode 101 in FIG. 6, that is, not in the side upper than an upper-limit of the bonded portion (a boundary portion) of the solder 4.

Since stress-relaxation structure portion 39 of Embodiment 2 includes the electrode non-connection portion 38, the second electrode portion 103 of the capacitor 100 can be made unfixed to the lead frame 1. According to the stress-relaxation structure portion 39 of Embodiment 2, because of the second electrode portion 103 of the capacitor 100 being made unfixed to the lead frame 1, a portion near the second electrode portion 103, that is, the electrode non-connection portion 38 somewhat moves when the molding pressure acts thereto at the time of mold-forming. Thus, the stress at the time of mold-forming that acts to the capacitor 100 is reduced, so that the capacitor 100 is prevented from being broken down.

Further, according to the power semiconductor device 50 of Embodiment 2, since the mold resin 5 is being filled in between the second electrode portion 103 and the electrode non-connection portion 38 after mold-forming, a sufficient fixing strength of the capacitor can be achieved. The second electrode portion 103 can be formed in such a manner that a part of the electro-conductive stress-relaxation portion 30 which constitutes the electrode non-connection portion 38 is kept unconnected to the surface of the external electrode 101, and a highly heat-resistant polyimide resin or the like that prevents the solder 4 from supplying thereto is applied onto the surface. Other than the polyimide, aluminum may be used. By applying aluminum onto the surface of the external electrode 101, it is possible to prevent a part of the electro-conductive stress-relaxation portion 30 which constitutes the electrode non-connection portion 38, from connecting to the electrode, and to prevent the electrode from being supplied the solder. Such a layer of aluminum can be formed by sintering using an aluminum powder, as being stacked on the electrode of the capacitor 100.

In FIG. 6, a configuration example is shown in which, on the lateral face of the external electrode 101 of the capacitor 100, there is placed the first electrode portion 102 to which the electrode connection portion 37 can be connected and which is solderable by the solder 4, and along with the opposite face of the capacitor 100 that is opposite to the lead frame 1, there is placed the second electrode portion 103 which allows the formation of the electrode non-connection portion 38 and which is not solderable by the solder 4. Note that in the power semiconductor device 50 of Embodiment 2, a contrivance may be applied to the lead frame 1 for forming the second electrode portion 103. Specifically, the lead frame 1 in the power semiconductor device 50 of Embodiment 2 may be provided with a structure in which a non-solderable electrode layer is placed on a part of the capacitor mounting portion 13 of the lead frame 1 opposite to the capacitor 100, or a structure in which a non-solderable polyimide resin layer is placed on a part of the capacitor mounting portion 13. In this case, because a contrivance has been applied to the lead frame 1-side, there is no need to place a layer of a polyimide resin or aluminum that is a material different to that of the external electrode 101, on a portion that constitutes the first electrode portion 102 of the capacitor 100.

Embodiment 3

Figure 7:
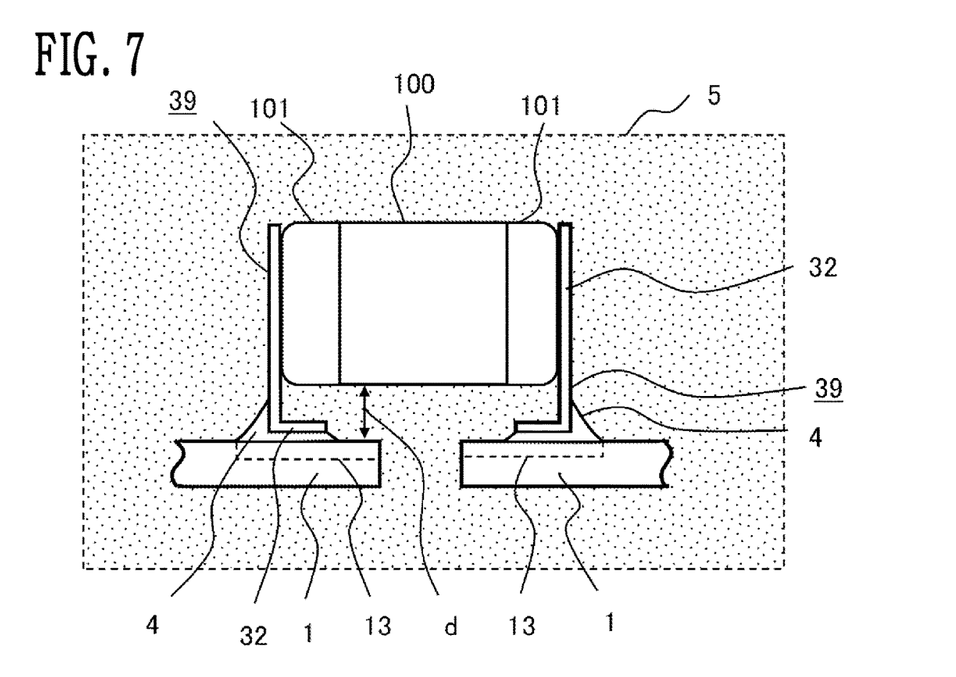
FIG. 7 is a diagram showing a stress-relaxation structure portion according to Embodiment 3 of the invention.

FIG. 7 is a diagram showing a stress-relaxation structure portion according to Embodiment 3 of the invention. The power semiconductor device 50 of Embodiment 3 includes the stress-relaxation structure portion 39 formed of a metal plate 32 that is lower in rigidity than the body of the capacitor 100. One end of the metal plate 32 is connected to the external electrode 101 of the capacitor 100, and the other end of the metal plate 32 is connected to the capacitor mounting portion 13 of the lead frame 1. Since the stress-relaxation structure portion 39 is provided with a structure in which the metal plate 32 is interposed between the capacitor 100 and the lead frame 1, the stress produced in the capacitor 100 due to the molding pressure applied to the capacitor 100 at the time of mold processing, the mold clamping at the time of molding, the temperature cycle at the time of operation of the power semiconductor device 50, or the like, can be mitigated by a deformation of the metal plate 32. As a result, a capacitor failure due to the stress produced in the capacitor 100 can be prevented, so that the fabrication yield can be enhanced.

In the stress-relaxation structure portion 39 of Embodiment 3, the lower in rigidity the metal plate 32 is, the greater the effect of reducing the stress of the capacitor becomes. Further, in the stress-relaxation structure portion 39 of Embodiment 3, the longer the length corresponding to the distance d between the capacitor 100 and the lead frame 1 is, the greater the effect of reducing the stress of the capacitor becomes. As the material of the metal plate 32, an invar-based material that is near in linear expansion coefficient to the capacitor 100 is preferable. Since the power semiconductor device 50 of Embodiment 3 includes the stress-relaxation structure portion 39 formed of the metal plate 32, it suffices that the rigidity of the metal plate 32 meets such a condition that it can endure the production processing in which the capacitor 100, the stress-relaxation structure portion 39, and the lead frame 1 are encapsulated with the mold resin 5.

Meanwhile, in in-vehicle apparatuses, a highly vibration-resistant characteristic is required. It is unable to satisfy reliability by solely applying the stress-relaxation structure portion 39 of Embodiment 3, that is, the metal plate 32, to the encased-type semiconductor device which has been described as a conventional power semiconductor device for in-vehicle use. The reason will be explained. As described previously, the encased-type semiconductor device is configured by mounting a power semiconductor element and chip components on an insulative board with a patterned wiring, and making connections with the semiconductor element and the chip components using wiring members followed by encapsulating the resultant with a silicone gel or the like. Thus, because the silicone gel is likely to vibrate, it is unable to satisfy reliability by solely applying the metal plate 32.

In contrast, even when a highly vibration-resistant characteristic is required, according to the power semiconductor device 50 of Embodiment 3, it is possible to satisfy reliability, because the stress-relaxation structure portion 39 formed of the metal plate 32 is provided, and the power semiconductor element 2 and the chip components such as the capacitor 100 and the like, that are mounted on the lead frames 1, are encapsulated with the mold resin 5 that is less likely to vibrate than the silicone gel.

There is also another encapsulation method by potting with a high elastic epoxy resin or the like; however, by such a method, its processing time for pouring the epoxy resin is long, which results in inclusion of foams. When foams are included in the potted resin, there emerges a need to make larger the insulation distance between components that are required to ensure insulation. The components required to ensure insulation includes the lead frames 1, the wiring members 3, the electrodes of the power semiconductor elements 2, and electrodes of the chip components such as the external electrodes 101 of the capacitor 100, and the like. In contrast, according to the encapsulation by transfer molding applied to the power semiconductor device 50 of Embodiment 3, the encapsulation is carried out by mold-forming at a high pressure reaching up to 100 atmospheres. Thus, foams and the like are not included in the mold resin 5, so that it is possible to make smaller the insulation distance that is required to ensure insulation between the components. As a result, it becomes possible to downsize the power semiconductor device 50.

Embodiment 4

Figure 8:
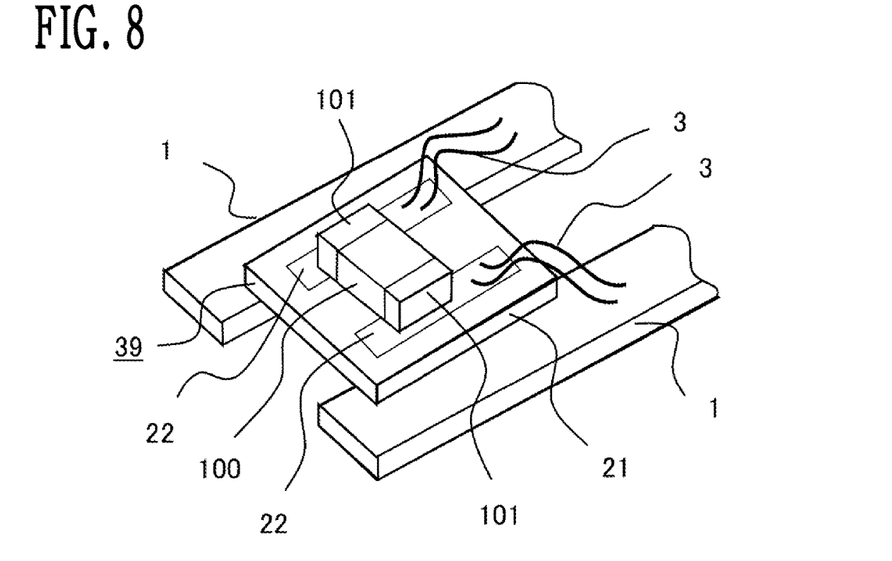
FIG. 8 is a diagram showing a capacitor mounting structure according to Embodiment 4 of the invention.

FIG. 8 is a diagram showing a capacitor mounting structure according to Embodiment 4 of the invention. The power semiconductor device 50 of Embodiment 4 is provided with a structure in which a wiring pattern 22 formed on an insulative wiring board 21 that is fixed between two lead frames 1 and the external electrodes 101 of the capacitor 100 are bonded together, and the wiring pattern 22 formed on the insulative wiring board 21 and each lead frame 1 are electrically connected to each other using another wiring member 3 such as a wire bond. That is, the power semiconductor device 50 of Embodiment 4 includes the stress-relaxation structure portion 39 formed of the wiring board 21 that is lower in rigidity than the lead frame 1 and the capacitor 100. According to the power semiconductor device 50 of Embodiment 4, by thus placing the wiring board 21 between the capacitor 100 and the lead frames 1, the stress due to the molding pressure at the time of mold-forming or due to the mold clamping in the mold-forming is mitigated by the wiring board 21. Thus, no stress is produced directly in the capacitor 100, so that the capacitor 100 can be prevented from failing.

Further, in the power semiconductor device 50 of Embodiment 4, since the wiring board 21 is interposed between the capacitor 100 and the lead frames 1, even when the temperature cycle emerges at the time of operation of the power semiconductor device 50, the difference in linear expansion coefficient between the capacitor 100 and the wiring board 21 is made smaller. Thus, in the power semiconductor device 50 of Embodiment 4, the thermal stress produced in the capacitor 100 is made smaller, so that the capacitor 100 can be prevented from failing. As the material of the wiring board 21, it is preferable to have a small difference in linear expansion coefficient to the material of the lead frame 1 and, for example, FR-4 (Flame Retardant-4) formed of a glass fiber cloth with an epoxy resin impregnated therein, is preferable.

Figure 9:
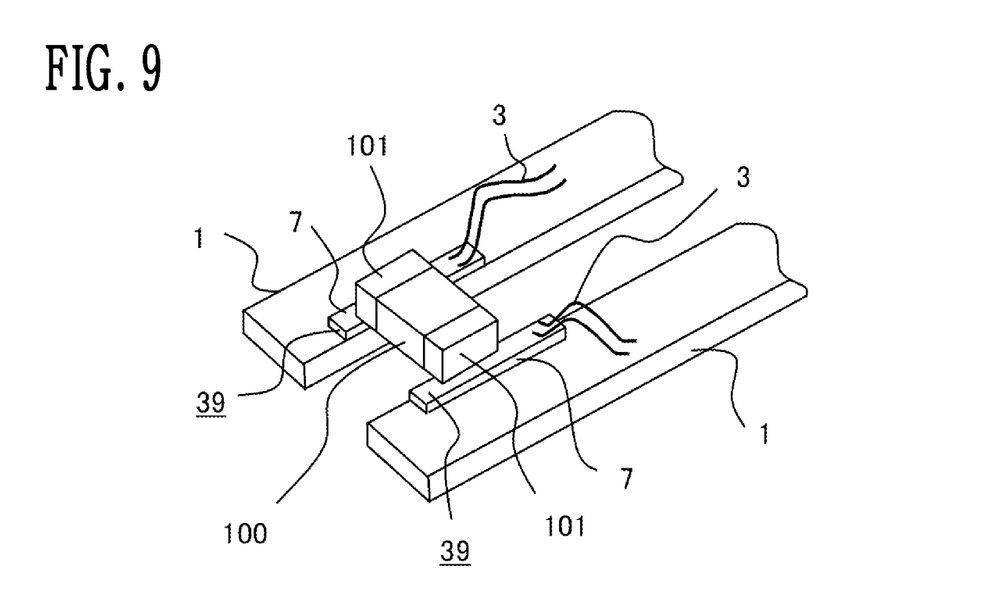
FIG. 9 is a diagram showing another capacitor mounting structure according to Embodiment 4 of the invention.

It is noted that, illustrated in FIG. 8 is a case of using the insulative wiring board 21; however, as shown in FIG. 9, another capacitor mounting structure that uses second lead frames 7 may be employed. FIG. 9 is a diagram showing the other capacitor mounting structure according to Embodiment 4 of the invention. In FIG. 9, the capacitor 100 is joined onto the second lead frames 7 each fixed to the lead frame 1 as being insulated from each other. In this case, by making the thickness of the second lead frame 7 smaller than the thickness of the lead frame 1, it is possible to mitigate the thermal stress in the capacitor due to the temperature cycle.

According to the power semiconductor device 50 of Embodiment 4, by placing between the capacitor 100 and the lead frames 1, the wiring board 21 or the second lead frames 7 insulated from the lead frames 1, it is possible to prevent the thermal stress due to the molding pressure at the time of mold-forming and due to the temperature cycle at the time of operation, from transferring directly to the capacitor 100. Thus, according to the power semiconductor device 50 of Embodiment 4, similarly to Embodiments 1 to 3, the stress to be produced in the capacitor 100 at the time of operation or at the time of fabrication is mitigated by the stress-relaxation structure portion 39 that is lower in rigidity than the capacitor, so that the capacitor 100 can be prevented from being broken down.

In any of the above embodiments, the power semiconductor element 2 may be formed of silicon. Instead, it may be formed of a wide bandgap semiconductor material that is wider in bandgap than silicon. Examples of the wide bandgap semiconductor material include silicon carbide, a gallium nitride family material and diamond.

Since the power semiconductor element 2 formed of such a wide bandgap semiconductor material has a higher breakdown voltage and also a higher allowable current density, it is possible to downsize the power semiconductor element 2. By using such a downsized power semiconductor element 2, it becomes possible to downsize the power semiconductor device 50 with that element incorporated therein.

It should be noted that unlimited combination of the respective embodiments, any modification of the embodiments and any omission in the embodiments may be made in the present invention without departing from the scope of the invention.

DESCRIPTION OF REFERENCE NUMERALS AND SIGNS

1: lead frame, 2, 2a, 2b, 2c: power semiconductor element, 3: wiring member, 4: solder, 5: mold resin, 7: second lead frame, 21: wiring board, 30: electro-conductive stress-relaxation portion, 32: metal plate, 37: electrode connection portion, 38: electrode non-connection portion, 39: stress-relaxation structure portion, 50: power semiconductor device, 100: capacitor, 101: external electrode, 111: non-connected portion.

The invention claimed is:

1. A power semiconductor device encapsulated with a mold resin, comprising:
   a plurality of lead frames formed into like a wiring pattern;
   a power semiconductor element joined onto the lead frame; and
   a capacitor placed between mutually adjacent two of the lead frames;
   wherein the capacitor is characterized in that external electrodes of the capacitor are connected to the lead frames each through a stress-relaxation structure portion that is lower in rigidity than the capacitor;
   wherein joining structure of the capacitor and each of the lead frames comprises the stress-relaxation structure portion connected to the external electrode of the capacitor, and a solder that connects the stress-relaxation structure portion with the lead frame; and wherein the stress-relaxation structure portion is lower in rigidity than the solder;
   wherein the stress-relaxation structure portion has an electrode connection portion connected to the external electrode of the capacitor, and an electrode non-connection portion is not connected to the external electrode and the capacitor.

2. The power semiconductor device of claim 1, wherein the stress-relaxation structure portion includes an electro-conductive stress-relaxation portion formed of a resin in which an electro-conductive filler is mixed.

3. The power semiconductor device of claim 2, wherein the capacitor has a non-connected portion to which the stress-relaxation structure portion is not connected, on the external electrode of the capacitor in the side opposite to the lead frame, and the non-connected portion is covered with the mold resin.

4. The power semiconductor device of claim 3, which is disposed on a rotating electrical machine for in-vehicle use to thereby supply a current to an armature of the rotating electrical machine.

5. The power semiconductor device of claim 4, wherein the power semiconductor element is formed of a wide bandgap semiconductor material,
   wherein the wide bandgap semiconductor material is one of materials consisting of silicon carbide, a gallium nitride family material and diamond.

6. The power semiconductor device of claim 3, wherein the power semiconductor element is formed of a wide bandgap semiconductor material,
   wherein the wide bandgap semiconductor material is one of materials consisting of silicon carbide, a gallium nitride family material and diamond.

7. The power semiconductor device of claim 2, which is disposed on a rotating electrical machine for in-vehicle use to thereby supply a current to an armature of the rotating electrical machine.

8. The power semiconductor device of claim 7, wherein the power semiconductor element is formed of a wide bandgap semiconductor material,
   wherein the wide bandgap semiconductor material is one of materials consisting of silicon carbide, a gallium nitride family material and diamond.

9. The power semiconductor device of claim 2, wherein the power semiconductor element is formed of a wide bandgap semiconductor material,
   wherein the wide bandgap semiconductor material is one of materials consisting of silicon carbide, a gallium nitride family material and diamond.

10. The power semiconductor device of claim 1, wherein the capacitor has a non-connected portion to which the stress-relaxation structure portion is not connected, on the external electrode of the capacitor in the side opposite to the lead frame, and the non-connected portion is covered with the mold resin.

11. The power semiconductor device of claim 10, which is disposed on a rotating electrical machine for in-vehicle use to thereby supply a current to an armature of the rotating electrical machine.

12. The power semiconductor device of claim 11, wherein the power semiconductor element is formed of a wide bandgap semiconductor material,
   wherein the wide bandgap semiconductor material is one of materials consisting of silicon carbide, a gallium nitride family material and diamond.

13. The power semiconductor device of claim 10, wherein the power semiconductor element is formed of a wide bandgap semiconductor material,
   wherein the wide bandgap semiconductor material is one of materials consisting of silicon carbide, a gallium nitride family material and diamond.

14. The power semiconductor device of claim 1, which is disposed on a rotating electrical machine for in-vehicle use to thereby supply a current to an armature of the rotating electrical machine.

15. The power semiconductor device of claim 14, wherein the power semiconductor element is formed of a wide bandgap semiconductor material,
   wherein the wide bandgap semiconductor material is one of materials consisting of silicon carbide, a gallium nitride family material and diamond.

16. The power semiconductor device of claim 1, wherein the power semiconductor element is formed of a wide bandgap semiconductor material,
   wherein the wide bandgap semiconductor material is one of materials consisting of silicon carbide, a gallium nitride family material and diamond.

\* \* \* \* \*